United States Patent
Hong

(10) Patent No.: US 10,777,261 B2
(45) Date of Patent: Sep. 15, 2020

(54) BI-DIRECTIONAL INPUT/OUTPUT ENABLE SIGNAL PROPAGATION STRUCTURE AND METHOD

(71) Applicant: Taiwan Semiconductor Manufacturing Company, Ltd., Hsinchu (TW)

(72) Inventor: Hyunsung Hong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/016,132

(22) Filed: Jun. 22, 2018

(65) Prior Publication Data
US 2019/0392891 A1    Dec. 26, 2019

(51) Int. Cl.
| | | |
|---|---|---|
| *G11C 11/418* | (2006.01) | |
| *G06F 13/16* | (2006.01) | |
| *G11C 11/417* | (2006.01) | |
| *G11C 11/419* | (2006.01) | |
| *G06F 13/42* | (2006.01) | |

(52) U.S. Cl.
CPC ........ *G11C 11/418* (2013.01); *G06F 13/1689* (2013.01); *G06F 13/4282* (2013.01); *G11C 11/417* (2013.01); *G11C 11/419* (2013.01)

(58) Field of Classification Search
None
See application file for complete search history.

(56) References Cited

U.S. PATENT DOCUMENTS

| 5,212,663 A | * | 5/1993 | Leong | ...................... G11C 7/20 |
|---|---|---|---|---|
| | | | | 365/189.16 |
| 2015/0092476 A1 | * | 4/2015 | Lin | ...................... G11C 7/1075 |
| | | | | 365/154 |

* cited by examiner

*Primary Examiner* — James G Norman
(74) *Attorney, Agent, or Firm* — Merchant & Gould P.C.

(57) ABSTRACT

A data-processing device, such as a memory device, includes a signal generator configured to transmit an enable-signal, and a plurality of circuit elements arranged in an array of plurality of rows spaced along a direction, each of the plurality of the circuit elements configured to receive the enable-signal from the signal generator and to input and output data as a result of receiving the enable-signal. The device also includes an input/out (I/O) interface operatively connected to the plurality of circuit elements and located to propagate data from the I/O interface to the circuit elements in a first direction relative to the direction in which the rows are spaced and receive data propagated from the circuit elements to the I/O interface in a second direction relative to the first direction. The signal generator maintains the direction of enable-signal propagation relative to the direction of data propagation regardless of the direction of data propagation.

20 Claims, 5 Drawing Sheets

BI-DIRECTIONAL INPUT/OUTPUT ENABLE SIGNAL PROPAGATION STRUCTURE AND METHOD

BACKGROUND

This disclosure relates generally to timed input and output operations and circuits in electronics circuits. This disclosure more specifically relates to memory read and write method and apparatus with improved performance and reliability.

Certain timed input and output operations, such as READ and WRITE operations for memory devices, such as memory arrays, entail input and/or output events synchronized with clock pulses. In reading and writing to a memory array, for example, a train of clock pulses may be applied to the drivers for respective rows of memory cells to enable the read or write operations of selected rows at each clock pulse. Fast and reliable READ and WRITE operations may be achieved by shorter clock cycles and reduced time lapse between the clock pulses and respective READ or WRITE operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
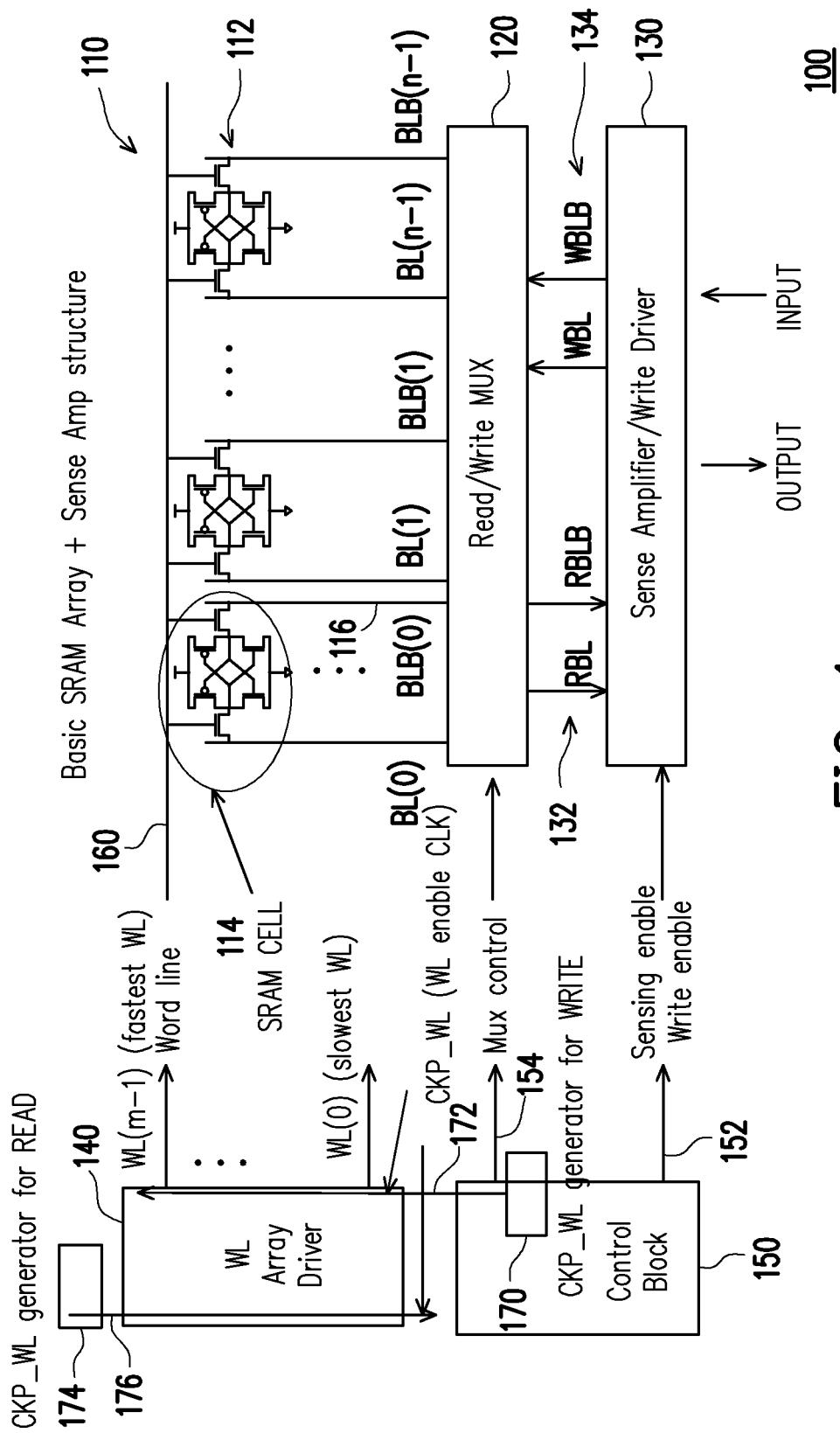
FIG. 1 shows a schematic diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure pertains to devices and methods employing timed input and output operations. Certain embodiments specifically pertain to the READ and WRITE operations for memory arrays, such as arrays of static random access memory (SRAM) cells, dynamic random access memory (DRAM) cells or any other type of memory cells susceptible to READ and WRITE operations.

With reference to FIG. 1, according to an embodiment, a memory device (100), such as an SRAM chip, includes a memory array (110), which includes m rows (112) of memory cells (114), with n memory cells in each row. The memory array thus has m rows by n columns of memory cells. Each memory cell (114) in this particular example is a six-transistor SRAM cell but can be any other suitable type of memory cell. The m memory cells (114) in each column in this case share a pair of data lines (116), which are bitlines BL and BLB. The memory device (110) also includes a read/write multiplexer (120) (MUX) and a sense amplifier/write driver (130), which is connected to the read/write MUX by data lines. The data lines include one or more pairs of READ data lines (132), which are READ bitlines RBL and RBLB, and by one or more pairs of WRITE data lines (134), which are WRITE bitlines WBL and WBLB. The read/write MUX (120) is a multiplexer/demultiplexer, with the multiplexer selecting data from data lines (116) to output to the sense amplifier/write driver (130) in READ operations; the demultiplexer (DEMUX) outputs data to appropriate columns of the memory array (110) from the sense amplifier/write driver (130) in WRITE operations.

The memory device (100) further includes a WL array driver (140) and a control block (150). The WL array driver (140) has outputs connected, via respective wordlines, to the respective memory cells (114) to enable or disable data transfer from the memory cells (114) to and from the data lines (116). The control block (150) is connected to the sense amplifier/write driver (130) via a sensing-enable/write-enable line (152) to enable and disable the sense amplifier portion and write driver portion of the sense amplifier/write driver (130). The control block (150) is further connected to the read/write MUX (120) via a MUX control line (154) to enable and disable the MUX portion and DEMUX portion of the read/write MUX (120).

The memory device (100) further includes a first WL clock pulse generator (170) and a second WL clock pulse generator (174), each of which generates clock pulses supplied to the WL drivers in the WL array driver (140).

Each row (112) of memory cells (114) can be enabled, via a wordline (160), to input (WRITE) for storage or output (READ) the stored data via a "wordline" by a WL driver in the WL array driver (140). Multiple wordlines (160) (e.g., m wordlines, from wordline ("WL")-0 to WL-(m−1)) can be used to connect respective rows of memory cells to respective WL drivers. The WL drivers can be enabled, at least in part, by clock pulses originated at the first wordline-enable clock pulse ("CKP_WL") generator (170).

Because the wordlines (160) are spatially distributed, each wordline may be disposed at a different distance from the first CKP_WL generator (170). As a result, the clock pulses for each clock cycle will reach the respective wordlines (160) at different times. For example, WL-0 may be located the closest to the first CKP_WL generator (170) and will thus receive its clock pulse the earliest; WL-(m−1) may be located the farthest from the first CKP_WL generator (170) and will thus receive its clock pulse the latest in the same clock cycle. The direction of the propagation of clock pulses from the first CKP_WL generator (170) is indicated by arrow (172) in FIG. 1.

Likewise, because the rows (112) of memory cells (114) are spatially distributed, each row (112) may be disposed at a different distance from the output/input ("I/O") port for the memory array (which includes the read/write MUX (120) and the sense amplifier/write driver (130)). Data propagate in the direction from Row-0 to Row-(m−1) in a WRITE operation, and in the direction from Row-(m−1) to Row-0 in a READ operation. As a result, data signals will arrive at the rows (112), or from the rows (112), at different times. For example, in a WRITE operation in the m-row memory array (160), Row-0 may be located the closest to the I/O port and will thus receive the data the earliest; Row-(m−1) may be located the farthest from the I/O port and will thus receive its data the latest in the same clock cycle. In a READ operation in the same m-row memory array, the data from Row-0 will arrive at I/O port the earliest; data from Row-(m−1) will arrive at the I/O port the latest in the same clock cycle.

Thus, the direction of data propagation is the same as the direction of clock pulse propagation from the first CKP_WL generator (170) for WRITE operations but opposite for READ operations. Data propagation therefore bears a substantially the same time relationship to the wordline-enable clock pulse propagation for every row (112) in the memory array (110) in WRITE operations. That is, for rows (112), data arrives at each row substantially the same amount of time after the arrival of the corresponding wordline-enable clock pulse at the WL driver for that row. Therefore, a new clock cycle can begin substantially immediately after the WRITE operation in the previous cycle is complete for the closest row, Row-0 in this example.

If the same WL-enable clock pulse generator (170) is used for READ operations, as is typically the case in conventional memory devices, the time interval between the launching of a WL-enable clock pulse and receiving the stored data from each row (112) at the I/O port is different: The time interval for Row-0 is the shortest; the time interval for Row-(m−1) is the longest. A new clock cycle cannot begin after the READ operation for Row-(m−1) in the previous cycle is complete.

With the conventional WL-enable clock scheme, wherein a single direction of WL-enable clock pulse propagation is used for both READ and WRITE operations, the direction of data propagation of only one of READ and WRITE is matched with the direction of WL-enable clock pulse propagation. The mismatch of propagation directions for the other operation result in long cycle time and poor performance as compared to the operation with matched propagation directions.

The embodiments disclosed in the present disclosure provide devices and methods in which two or more directions of propagation of WL-enable clock pulses are provided. More specifically, for each operation (e.g., READ or WRITE), a direction of propagation of WL-enable clock pulses is provided that matches the direction of data propagation for that operation.

Figure 5:
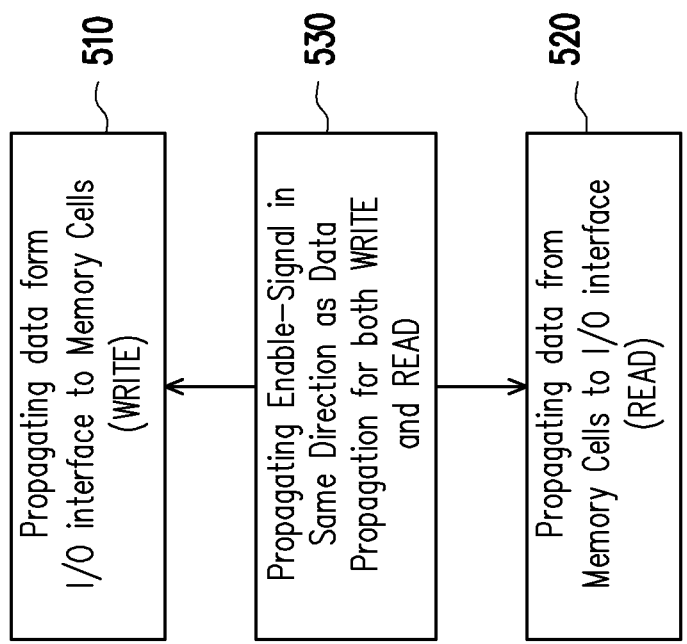
FIG. 5 outlines a method of data input and output for a memory device according some embodiments.

More generally, referring to FIG. 5, a method of inputting data to, and outputting data from, a memory array according to some embodiments includes a WRITE operation (510), in which data propagate from the I/O interface to the memory cells, and a READ operation (520), in which data propagate from the memory cells to the I/O interface. The method further includes propagating (530) an enable-signal to the memory cells to enable the memory cells to input data in the WRITE operation and output data in the READ operation. The direction of propagating the enable-signal is fixed relative to the direction of data propagation for both WRITE and READ operations. For example, the direction of propagating the enable-signal can be chosen to be the same as the direction of data propagation for both WRITE and READ operations.

Reference to FIG. 1 again, in one embodiment, matching propagation directions between WL-enable clock pulses and data for both READ and WRITE operations is provided by two CKP_WL generators disposed at row-wise opposite ends of the memory array (110) and launching WL-enable clock pulses in opposite directions. Thus, in addition to the first CKP_WL generator (170) located at the WL-0 end of the WL array drive (140), a second CKP_WL generator (174) is disposed at the WL-(m−1) end of the WL array drive (140). The WL-enable clock pulses generated by the second CKP_WL generator (174) propagate in a direction (176) that is the same as the direction of data propagation in READ operations. By activating the first CKP_WL generator (170) during WRITE operations and second CKP_WL generator (174) during READ operations, directional matching between CKP_WL propagation and data propagation is achieved for both READ and WRITE operations.

Figure 2:
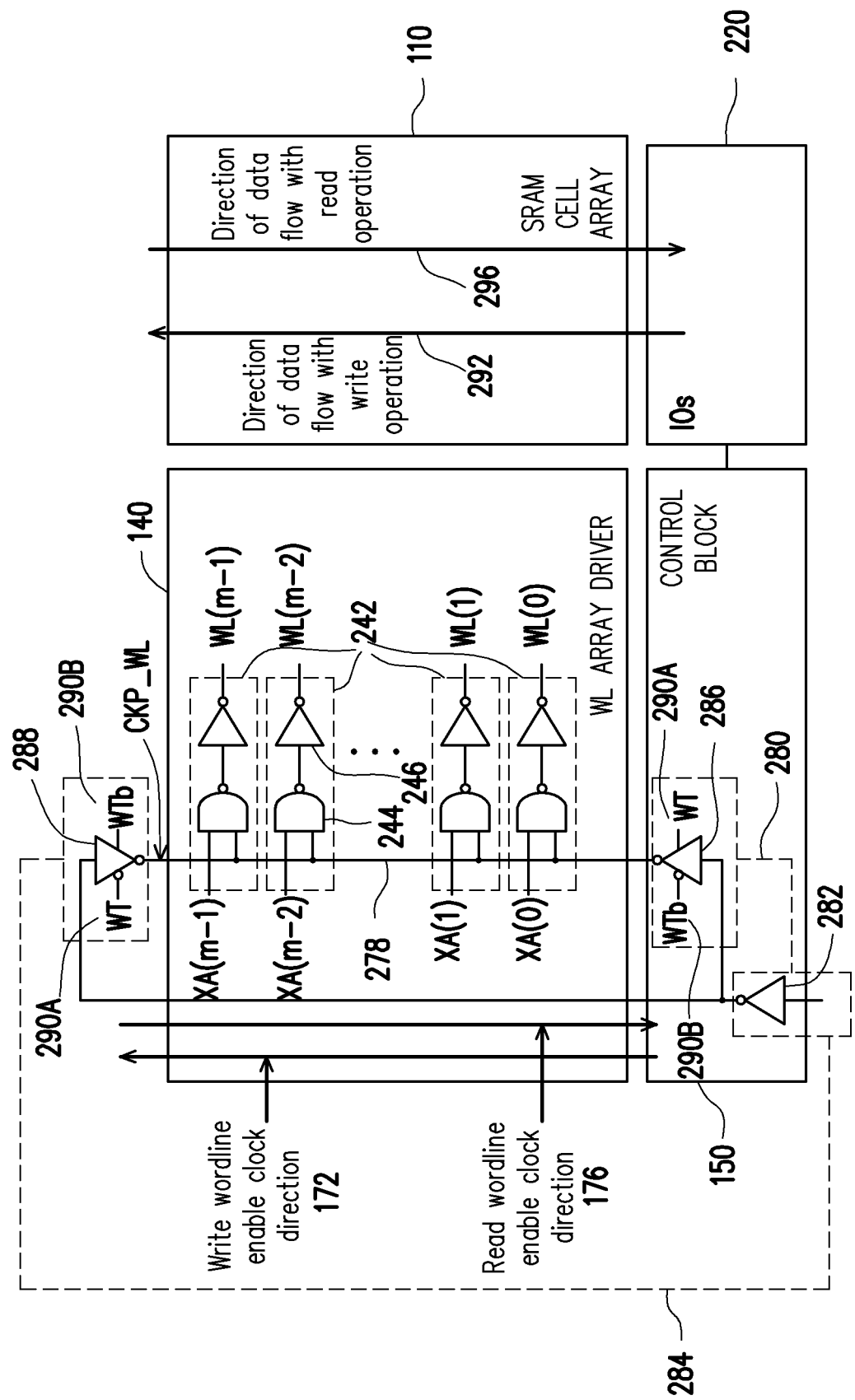
FIG. 2 shows a schematic diagram of a memory device, with details shown for a wordline drivers and wordline-enable clock pulse generator, in accordance with some embodiments.

With further reference to FIG. 2, in an embodiment, the WL array driver 140 includes an array of WL drivers (242). Each WL driver (242) includes a NAND gate (244), with CKP_WL and WL-Select (XA<0> through XA<m−1>) as inputs, and a driver (246), with the output of the NAND gate (244) as its input, and its output connected to the respective wordline. The CKP_WL for the ith row thus enables wordline, WL-i, for Row-i. In this example, like in FIG. 1, Row-0 is nearest the I/O interface (220), which includes read/write MUX (120) and sense amplifier/write driver (130), and Row-(m−1) the farthest.

In this example, the wordline-enable clock pulses are propagated to the WL drivers (242) on a clock line (278). The wordline-enable clock pulses can be launched from either end by a respective CKP_WL generator. A first CKP_WL generator (280), comprised of a clock pulse generator (CKP) (282) and a first driver (286), is disposed to launch wordline-enable clock pulses from one end of the WL array driver, in this example the WL-0 end. A second CKP_WL generator (280), comprised of the clock pulse generator (CKP) (282) and a second driver (288), is disposed to launch wordline-enable clock pulses from the other end of the WL array driver, in this example the WL-(m−1) end.

Both drivers (286, 288) have their inputs connected to the output of the CKP (282), and outputs connected to the respective ends of the clock line (278). Each driver in this example can be enabled and disabled. Specifically, in this example, each of the the drivers (286, 288) is enabled and disabled by pair of complementary enabling signals WT (290A) and WTb (290B). The first driver (286) is enabled by WT (290A) and complement of WTb (290B); the second driver (288) is enabled by WTb (290B) and complement of WT (290A).

Thus, the signals (WT, WTb) for enabling the first drive (286) are complements, respectively, of the signals (WTb, WT) for enabling the second driver (288). As a result, when the first driver (286) is enabled, the second driver (288) is disabled, and vise versa. The wordline-enable clock pulses therefore propagate along the clock line (278) from the first driver (286), and in the direction from WL-0 toward WL-(m−1), when WT is "ON" (and WTb is "OFF"); and the wordline-enable clock pulses propagate from the second driver (288), and in the direction from WL-(m−1) toward WL-0, when WT is "OFF" (and WTb is "ON").

With the configurations in the embodiments described above, wordline-enable clock pulses can be propagated along the clock line (278) in a selectable direction. The direction of propagation of the wordline-enable clock pulses can be chosen to optimize the performance of at least one aspect of the memory device. In one example, the direction of propagation of the wordline-enable clock pulses can be chosen to the same direction as the data propagation for both READ and WRITE operations: For WRITE operations, in which data propagate in a direction (292) from the Row-0 toward Row-(m−1), the first driver (286) is enabled by the enabling signals WT (290A) and WTb (290B); at the same time, the second driver (288) is disabled by the enabling signals WT (290A) and WTb (290B). The CKP_WL generated by the CKP (282) thus propagates (172) from WL-0 toward WL-(m−1), in the same direction (292) as that of data propagation for WRITE operations. In the same example, for READ operations, in which data propagate in a direction (296) from the Row-(m−1) toward Row-0, the second driver (288) is enabled by the enabling signals WT (290A) and WTb (290B); at the same time, the first driver (286) is disabled by the enabling signals WT (290A) and WTb (290B). The CKP_WL generated by the CKP (282) thus propagates (176) from WL-(m−1) toward WL-0, in the same direction (296) as that of data propagation for READ operations.

As a result, the performance of memory operations for memory arrays with the embodiments described is improved as compared to the operations in which the direction of wordline-enable clock pulse propagation is opposite of the direction of data propagation. In the specific examples shown in FIGS. 1 and 2, in which the clock pulse generator (170, 282) is nearest the same end of the array as the I/O interface (220), READ operations are improved over prior art configurations.

Figure 3:
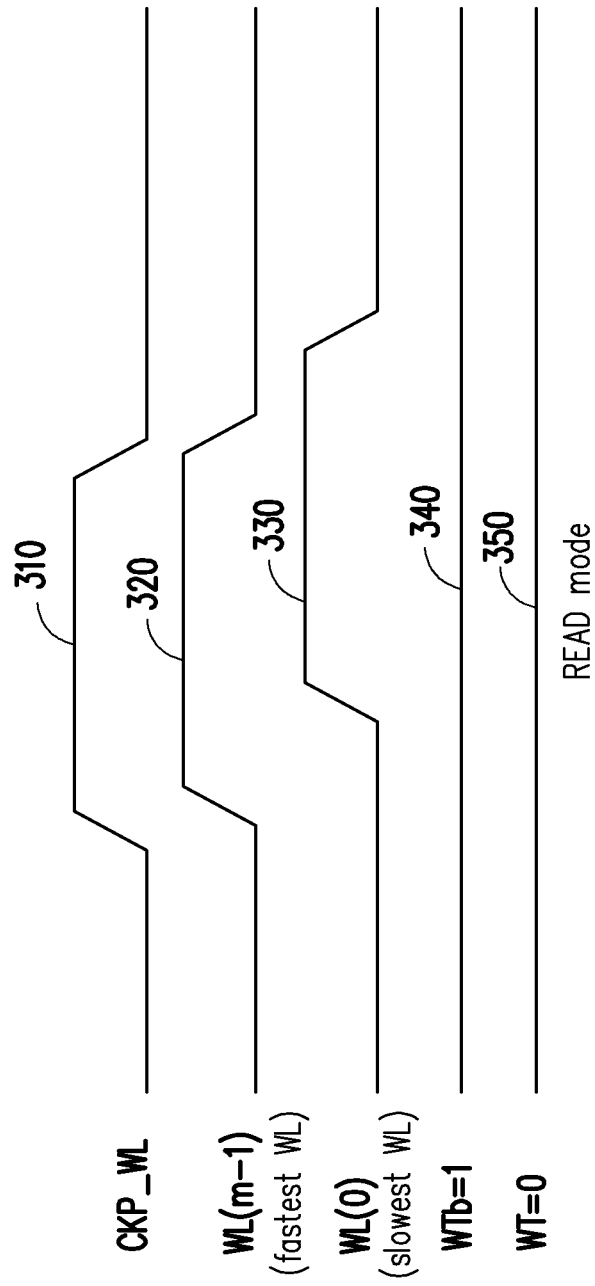
FIG. 3 schematically shows a timing diagram for a READ operation in accordance with some embodiments.

FIG. 3 schematically shows the timing of CKP_WL signal (310), WL-(m−1) signal (320), which is the fastest WL (i.e., receives the CKP_WL the earliest), WL-0 signal (330), WTb signal (340), and WT signal (350) for READ operations, i.e., WTb=1 and WT=0. There is a delay of the WL-(m−1) signal (320) from the CKP_WL signal (310); and there is a longer delay of the WL-(0) signal (330) from the CKP_WL signal (310).

Figure 4:
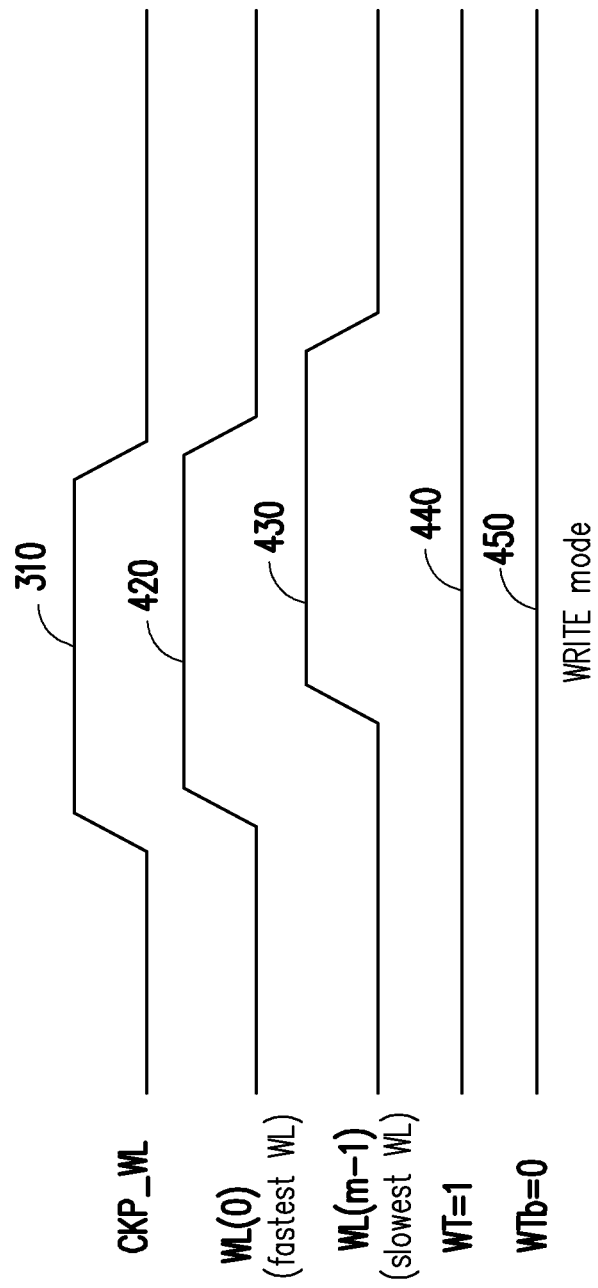
FIG. 4 schematically shows a timing diagram for a WRITE operation in accordance with some embodiments.

FIG. 4 schematically shows the timing of CKP_WL signal (310), WL-(0) signal (420), which is the fastest WL (i.e., receives the CKP_WL the earliest), WL-(m−1) signal (430), WT signal (440), and WT signal (450) for WRITE operations, i.e., WT=1 and WTb=0. There is a delay of the WL-(0) signal (420) from the CKP_WL signal (310); and there is a longer delay of the WL-(m−1) signal (430) from the CKP_WL signal (310).

Comparing FIGS. 3 and 4, it is evident that, with the embodiments shown in FIGS. 1 and 2, the delay between the CKP_WL signal and the fastest WL is the same for both READ and WRITE operations; and the delay between the CKP_WL signal and the slowest WL is the same for both READ and WRITE operations. READ and WRITE operations thus perform equally well.

The principles manifested in the embodiments above can be applied to additional applications. As an example, instead of an array (110) of memory cells (114), an array of any devices of a type that requires enable-signals for input and output can be configured as described above. As another example, instead of reversing the direction of propagation of clock pulses to match the direction of data propagation when the data operation type (READ or WRITE) changes, the I/O interface can be configured to maintain the direction of data propagation regardless of the operation type. For example, instead of having both input and output at the same end of the array (110), the I/O interface can be configured such that the input and output are disposed at opposite ends of the array (110). As with the other embodiments described above, the direction of propagation of CKP_WL is kept the same as the direction of data propagation for both WRITE and READ operations. For example, the input (for WRITE) can be disposed at the WL-0 end, and the output (for READ) can be disposed at the WL-(m−1) end. In other examples, the directions of CKP_WL propagation and data propagation can be kept opposite (anti-parallel) to each other for both WRITE and READ operations.

Thus, the embodiments disclosed herein provide improved performance for input and/or output operations for memory devices such as SRAM. The I/O interface(s) and the wordline-enable clock pulse generator(s) are arranged relative to the arrays of memory cells and configured to propagate wordline-enable clock pulses in a predetermined (e.g., same) direction relative to the direction of data propagation through the array for both READ and WRITE operations (i.e., regardless of data propagation is to or from the I/O interfaces). That is, the angle between the direction of CKP_WL propagation and direction of data propagation is kept the same (e.g., 0° or 180°) for both READ and WRITE operations. With such arrangement and configuration, fast and reliable input and output (e.g., READ and WRITE) operations can be achieved by shorter clock cycles and reduced time lapse between the clock pulses and respective READ or WRITE operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A data-processing device, comprising:
a first signal generator including a plurality of signal generator modules arranged along a first direction;
a second signal generator located and configured to transmit an enable-signal to the plurality of signal generator modules, each of the plurality of signal generator modules being configured to transmit an input/out (I/O) enable-signal as a result of receiving the enable-signal from the second signal generator;
an array of a plurality of rows of circuit elements, the plurality of rows sequentially arranged along the first direction, each of the plurality of rows of circuit elements configured to receive the I/O enable-signal from a respective one of the plurality of signal generator modules and to input and output data as a result of receiving the I/O enable-signal; and an I/O interface operatively connected to the plurality of circuit elements, the I/O interface and the circuit elements being mutually arranged to propagate data from the I/O interface to each of the plurality of rows of circuit elements in a WRITE-operation data flow direction during a WRITE operation and receive data propagated from each of the plurality of rows of circuit elements to the I/O interface in a READ-operation data flow direction during a READ operation;

the second signal generator being configured to transmit the enable-signal to the plurality of signal generator modules along a direction that is the same or opposite the first direction, keeping the directional relationship between the enable-signal transmission and the WRITE-operation data flow the same as the directional relationship between the enable-signal transmission and the READ-operation data flow.

2. The data-processing device of claim 1, wherein each of the circuit elements comprises a memory cell.

3. The data-processing device of claim 1, wherein the WRITE-operation data flow direction is opposite of the READ-operation data flow direction.

4. The data-processing device of claim 3, wherein each of the plurality of signal generator module includes a pulse generator and a driver, the driver being operatively connected to the pulse generator and the respective row of circuit elements to supply to the row an enable-signal corresponding to a signal received from the pulse generator.

5. The data-processing device of claim 1, wherein each of the plurality of signal generator modules is connected to a respective one of the plurality of rows of circuit elements and configured to propagate the I/O enable-signal to the row of circuit elements in a direction substantially transverse to the first direction.

6. The data-processing device of claim 1, wherein the I/O interface is located proximate one side of the array, and wherein the second signal generator comprises a first signal generator module located on the same side of the array as the I/O interface and a second signal generator module located on opposite side of the array from the I/O interface.

7. The data-processing device of claim 6, wherein the first and second signal generator modules of the second signal generator are configured to receive a control signal and mutually exclusively propagate signals in opposite directions.

8. The data-processing device of claim 6, wherein the first and second signal generator modules of the second signal generator comprise a common pulse generator, each of the first and second signal generator modules of the second signal generator further comprising a driver, the drivers being configured to be mutually exclusively enabled by the control signal.

9. The data-processing device of claim 1, wherein the second signal generator is configured to transmit the enable-signal to the plurality of signal generator modules along the WRITE-operation data flow direction during the WRITE operation and along the READ-operation data flow direction during the READ operation.

10. The data-processing device of claim 1, wherein the WRITE-operation data flow and READ-operation data flow directions are the same, and wherein I/O interface comprises an input interface located proximate one side of the array and an output interface located proximate opposite side of array from the input interface.

11. A memory device, comprising:
a plurality of memory cells, each configured to input data in a WRITE operation and output data in a READ operation, the memory cells being arranged in an array of plurality of rows sequentially arranged along a first direction, each of the rows including at least one of the memory cells, a signal generator including a plurality of signal generator modules arranged along the first direction and each configured to supply an input/output (I/O) enable-signal to a respective one of the rows of memory cells to enable the input and output of data, the signal generator further including a pulse signal generator located and adapted to propagate an enable-signal in a second direction to the plurality of signal generator modules to sequentially enable the signal generator modules to supply the respective I/O enable-signals; and an input/out (I/O) interface located proximate one side of the array, operatively connected to the plurality of memory cells, and configured to propagate data from the I/O interface to the memory cells in the first direction in the WRITE operation and to receive data propagated from the memory cells to the I/O interface in a third direction that is opposite to the first direction in the READ operation;

the signal generator and the array being mutually arranged to keep the directional relationship between the second and first directions in the WRITE operation the same as the directional relationship between the second and third directions in the READ operation.

12. The memory device of claim 11, wherein the direction of propagation of the enable-signal is the same as the first direction in the WRITE operation and is the same as the third direction in the READ operation.

13. The memory device of claim 11, wherein the pulse signal generator comprise a READ-enable signal generator configured to propagate enable signal from one side of the array, and a WRITE-enable signal generator configured to propagate enable signal from opposite side of the array.

14. The memory device of claim 13, wherein the WRITE-enable signal generator is located proximate the same side of the array as the I/O interface.

15. The memory device of claim 13, wherein the pulse signal generator further comprises a shared pulse signal line extending along the first direction, the READ-enable signal generator and WRITE-enable signal generator comprise a shared pulse generator, the READ-enable signal generator further comprising a driver operatively connected to one end of the shared pulse signal line, and the WRITE-enable signal generator further comprising a driver operatively connected to opposite end of the shared pulse signal line from the READ-signal generator, the pulse signal generator further comprising a plurality of drivers, each operatively connected to the shared pulse signal line and to one of the rows of memory cells, and being configured to supply an enable-signal to the respective row upon receiving an enable-signal from the shared pulse signal line.

16. A method of data input and output for a memory device, the method comprising:
a WRITE operation comprising propagating data from an input/output (I/O) interface to an array of plurality of memory devices disposed in rows at successively increasing distances along a first direction from the I/O interface and writing the data to the memory devices;
a READ operation comprising reading data from the plurality of memory devices and propagating the read data in a second direction opposite the first direction from the memory devices to the I/O interface;

propagating from an array of signal generators a respective plurality of I/O enable-signals to the respective plurality of rows of memory devices to enable the memory devices to input data in the WRITE operation and to output data in the READ operation; and propagating an enable-signal to the array of signal generators to enable them to transmit the I/O enable-signals, wherein the propagating the enable-signal includes propagating the enable-signal along the first or second direction from one side of the array during the READ operation and propagating the enable-signal to the plurality of memory devices along the second or first direction, respectively, from opposite side of the array during the WRITE operation.

17. The method of claim 16, wherein the propagating the enable-signal comprises propagating the enable-signal in the same direction as the data propagation direction in both the READ and WRITE operations.

18. The method of claim 16, further comprising generating from a same enable-signal generator the enable-signals propagated from the opposite sides of the array.

19. The method of claim 16, wherein the propagating enable-signal from opposite sides of the array comprises propagating enable-signal from opposite sides of the array on the same signal line.

20. The method of claim 19, wherein propagating enable-signal from opposite sides of the array on the same signal line comprises using a control signal to enable generation of the enable-signal at one side of the array while disabling generation of the enable-signal at the opposite side of the array.

* * * * *

UNITED STATES PATENT AND TRADEMARK OFFICE
CERTIFICATE OF CORRECTION

PATENT NO. : 10,777,261 B2  Page 1 of 1
APPLICATION NO. : 16/016132
DATED : September 15, 2020
INVENTOR(S) : Hyunsung Hong It is certified that error appears in the above-identified patent and that said Letters Patent is hereby corrected as shown below:

On the Title Page

(57) Abstract, Line 8: "an input/out (I/O) interface" should read --an input/output (I/O) interface--

In the Specification

Column 4, Line 57: "each of the the drivers" should read --each of the drivers--

Column 4, Line 67: "disabled, and vise versa." should read --disabled, and vice versa.--

In the Claims

Column 6, Line 58, Claim 1: "transmit an input/out (I/O)" should read --transmit an input/output (I/O)--

Column 8, Line 17, Claim 11: "an input/out (I/O) interface" should read --an input/output (I/O) interface--

Signed and Sealed this
Eighth Day of December, 2020

Andrei Iancu
*Director of the United States Patent and Trademark Office*